United States Patent
Ariel et al.

[11] Patent Number: 6,009,552
[45] Date of Patent: *Dec. 28, 1999

[54] SOFT-DECISION SYNDROME-BASED DECODER FOR CONVOLUTIONAL CODES

[75] Inventors: Meir Ariel, Tel Aviv; Reuven Meidan, Ramat Hasharon, both of Israel

[73] Assignee: Motorola, Inc., Schaumburg, Ill.

[*] Notice: This patent is subject to a terminal disclaimer.

[21] Appl. No.: 08/877,845

[22] Filed: Jun. 18, 1997

[51] Int. Cl.$^6$ .................................................. G01R 31/28
[52] U.S. Cl. ............................................ 714/780; 714/786
[58] Field of Search ...................................... 714/780, 785, 714/793, 786; 325/41; 375/99

[56] References Cited

U.S. PATENT DOCUMENTS

| | | | |
|---|---|---|---|
| 3,909,721 | 9/1975 | Bussgang et al. | 325/41 |
| 4,354,269 | 10/1982 | Vries et al. | 371/43 |
| 4,486,882 | 12/1984 | Piret et al. | 371/45 |
| 5,278,871 | 1/1994 | Rasky et al. | 375/99 |
| 5,598,422 | 1/1997 | Longwell et al. | 371/37.1 |

FOREIGN PATENT DOCUMENTS

| | | |
|---|---|---|
| 0 278 700 A2 | 8/1988 | European Pat. Off. . |
| 0 280 913 A2 | 9/1988 | European Pat. Off. . |
| 0 439 649 A1 | 8/1991 | European Pat. Off. . |
| 0 567 799 A1 | 11/1993 | European Pat. Off. . |
| 2 216 755 | 10/1989 | United Kingdom . |

OTHER PUBLICATIONS

Meir Ariel and Jakov Snyders, Soft Syndrome Decoding of Binary Convolutional Codes, IEEE Transactions On Communications, vol. 43, No. 2/3/4, Feb./Mar./Apr. 1995, pp. 288–297.

Primary Examiner—Emmanuel L. Moise
Assistant Examiner—Esaw Abraham
Attorney, Agent, or Firm—Sylvia Chen

[57] ABSTRACT

A soft-decision decoder computes a maximum likelihood estimated transmitted code from a demodulated received signal with less complexity compared to a conventional Viterbi soft-decision decoder. A symbol-by-symbol detector determines a hard-decision vector from a demodulated received signal vector. A syndrome calculator multiplies the hard-decision vector by a scalar parity check matrix to calculate a syndrome vector. A syndrome modifier examines the syndrome vector for predetermined syndrome patterns corresponding to isolated errors in the hard-decision vector. Syndrome patterns are removed from the syndrome vector to create a modified syndrome vector, and the corresponding error in the hard-decision vector is recorded in an estimated error vector. A syndrome-based decoder uses the modified syndrome vector to create a simplified error trellis to produce a remaining error vector. Subtracting the estimated error vector and the remaining error vector from the hard-decision vector creates a maximum likelihood estimated transmitted code vector.

14 Claims, 4 Drawing Sheets

SOFT-DECISION SYNDROME-BASED DECODER FOR CONVOLUTIONAL CODES

CROSS REFERENCE TO RELATED APPLICATIONS

This application is related to U.S. patent application Ser. No. 08/878,280 (attorney docket CE01423R) by inventors Reuven Meidan and Meir Ariel. The related application is filed on even date herewith, is assigned to the assignee of the present application, and is hereby incorporated herein in its entirety by this reference thereto.

FIELD OF THE INVENTION

This invention relates generally to communication systems, and more particularly to a reduced-complexity soft-decision decoder for use in a receiver of a convolutional code communication system.

BACKGROUND OF THE INVENTION

Convolutional codes are often used in digital communication systems to protect transmitted information from error. At the transmitter, an outgoing code vector may be described using a trellis diagram whose complexity is determined by the constraint length of the encoder. Although computational complexity increases with increasing constraint length, the robustness of the coding also increases with constraint length.

At the receiver, a practical soft-decision decoder, such as a Viterbi decoder, uses a trellis structure to perform an optimum search for the maximum likelihood transmitted code vector. The Viterbi algorithm, however, is computationally complex, and its complexity increases exponentially with increasing constraint length. This essentially means that a Viterbi decoder requires a significant amount of current and a tremendous millions of instructions per second (MIPS) capability for processing convolutional codes with large constraint lengths.

Vocoders for various communications systems, such as Direct Sequence Code Division Multiple Access (DS-CDMA) standard IS-95 and Global System for Mobile Communications (GSM), have such large constraint lengths. For example, the GSM half-rate constraint length K=7 and the IS-95 constraint length K=9.

Another disadvantage of Viterbi decoders is that a fixed number of computations must be performed for each code vector, irrespective of the actual number of errors that occurred during transmission. Thus, a Viterbi decoder processes a received signal having few transmission errors or no errors at all using the same number of computations as a received signal having many errors. There is a need for a soft-decision decoder that has a reduced current and MIPS processing requirement for convolutional codes with large constraint lengths and communication channels with low error rates.

DETAILED DESCRIPTION OF THE PREFERRED EMBODIMENT

Figure 1:
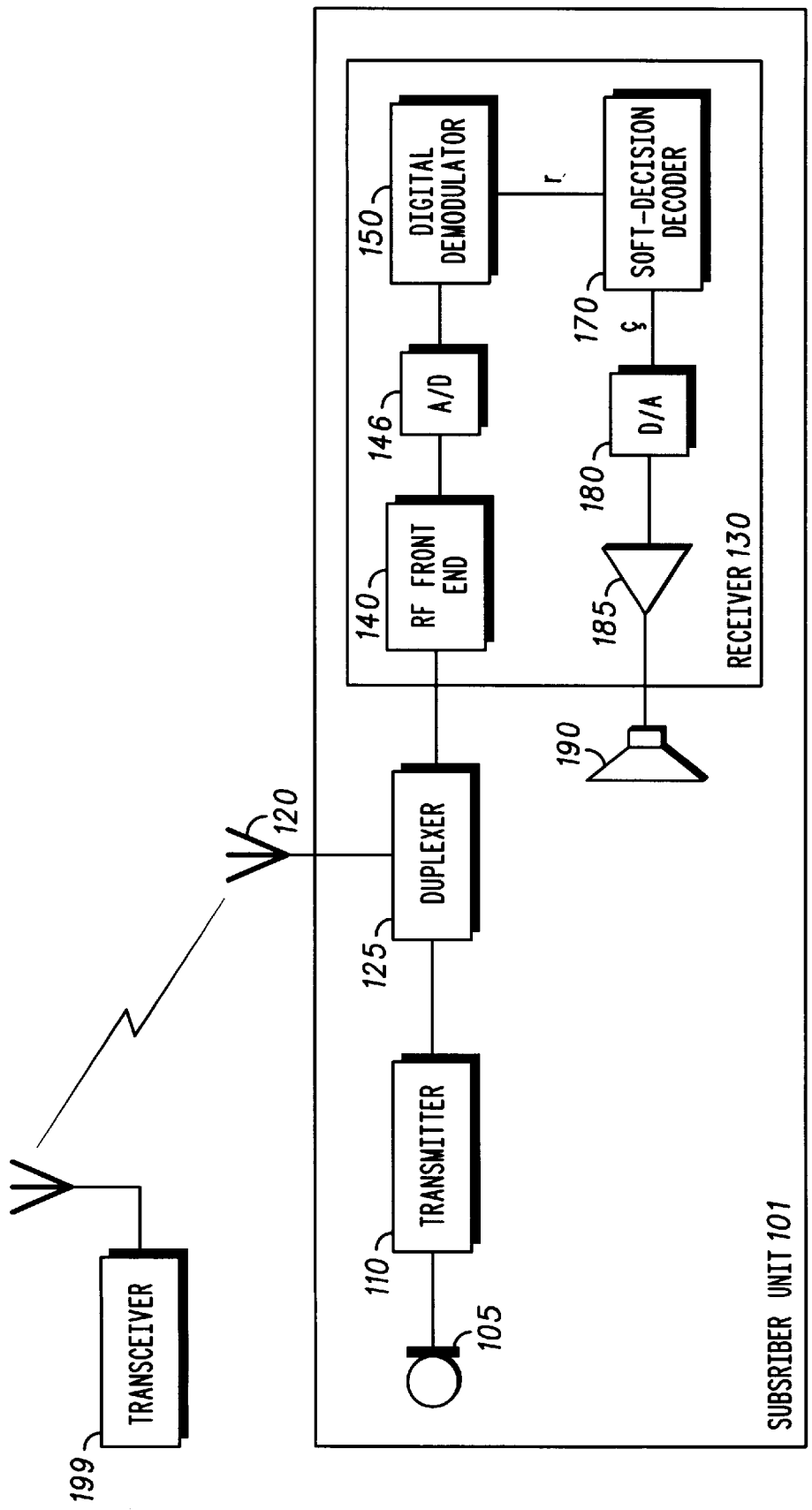
FIG. 1 shows a block diagram of a communication system with a receiver having a soft-decision decoder according to a preferred embodiment.

A soft-decision decoder uses a syndrome vector to detect the existence of transmission errors in a convolutional coding communication system. Let r denote a demodulated received signal vector. Then vector r is a vector of real numbers of dimension N. Let v denote the vector obtained by the symbol-by-symbol detection of demodulated received signal vector r. If the valid hard-decision symbols are binary, then v is a vector of dimension N having element values of either 0 or 1. Let us denote v=c+e, where c is the transmitted code vector. Then e is the transmission error vector. For the convolutional code C there exists a scalar parity check matrix H with M columns and N rows having binary symbols of 0 and 1 as components. The parity check condition that satisfies the transmitted code vector c is expressed by the relationship $Hc^t=0$, where superscript t denotes vector transposition. In other words, if c is a code vector belonging to convolutional code C (i.e., c is a transmitted code vector and $c \in C$), then $Hc^t=0$, where H is a matrix having M rows and N columns, c is a row vector of length N, and superscript t denotes vector transposition.

A syndrome vector s is a binary vector of dimension M defined as $s=Hv^t$. Because $v=c+e, s=H(c+e)^t$, and because $Hc^t=0$, then $s=He^t$. When a syndrome vector s=0, transmission error vector e=0, and no soft-decision maximum likelihood decoding is required. In other words, the symbol-by-symbol detected vector v is the maximum likelihood soft-decision decoded transmitted code vector ç, and soft-decision decoding of the received signal vector r is unnecessary.

Because zero transmission error is unlikely, the syndrome vector s is usually not equal to 0. A soft-decision syndrome-based decoder for convolutional codes computes the maximum likelihood estimated transmitted code vector ç by first computing the maximum likelihood transmission error vector ê. The soft-decision decoder includes a symbol-by-symbol detector, a syndrome calculator, a syndrome modifier, and a syndrome-based decoder. A symbol-by-symbol detector is a hard-decision detector that determines, symbol-by-symbol, a hard-decision vector v from a demodulated received signal vector r. Hard-decision vector v is multiplied by scalar parity check matrix H to create a syndrome vector S.

A memory stores syndrome patterns associated with likely transmission error patterns. For example, let $e_p$ denote a likely transmission error pattern in the hard-decision vector v, such as a single-bit transmission error or a double-bit transmission error. Due to the structure of scalar parity check matrices, there is a limited number of syndrome patterns that correspond to single-symbol hard-decision vector errors.

Let $s_p = He_p^t$, then $s_p$ is a complete syndrome vector of length M. Let syndrome pattern p be a segment of $s_p$ starting from the first nonzero element in $s_p$ and ending with the last nonzero element of $s_p$. To ensure optimal decoding, the syndrome pattern can be bracketed by zero bits on both sides. Reducing the number of zeros bracketing the syndrome pattern increases the speed of computation, but may result in a less optimal solution. The syndrome modifier compares the syndrome vector s computed by the syndrome calculator to known syndrome patterns p caused by isolated hard-decision vector errors. If a known syndrome pattern is detected, the syndrome modifier updates an estimated error vector $\ddot{e}$ and creates a simplified syndrome vector by subtracting the syndrome pattern from the syndrome vector. The modified syndrome vector is simplified in the sense that it contains more zeros than the original syndrome vector.

If the modified syndrome vector is equal to all zeros, the decoding is complete and the estimated error pattern $\ddot{e}$ is subtracted from vector v to form a maximum likelihood soft-decision decoded code vector ç. If the modified syndrome vector is not all-zero, the syndrome modification process described above is repeated and a new syndrome pattern is fetched from memory and compared with the modified syndrome vector. This process is repeated until all syndrome patterns in memory have been compared to the syndrome vector or until an all-zero modified syndrome vector is reached.

Estimated error vector $\ddot{e}$ can be used to compute the maximum likelihood transmitted code vector ç; ç=v−ê, where v is the vector output of the symbol-by-symbol detector and ê is the maximum likelihood transmission error vector. If modified syndrome vector $s'=H(v-\ddot{e})^t=0$, then $\hat{e}=\ddot{e}$. If modified syndrome vector $s'=H(v-\ddot{e})^t \neq 0$, then maximum likelihood transmission error vector $\hat{e}=\ddot{e}+e'$, where e' is a non-zero remaining error vector that needs to be identified via a search through a simplified error trellis. In this case, the syndrome-based decoder takes the modified syndrome vector s' from the syndrome modifier and uses it to make a simplified error trellis for determining remaining error vector e'. The output of the simplified error trellis e' plus the estimated error vector $\ddot{e}$ equals the maximum likelihood transmission error vector ê.

Once the maximum likelihood transmission error vector ê is identified, the maximum likelihood transmitted code vector ç=v−ê. This approach of simplifying a syndrome vector and using it to compute the maximum likelihood transmission error vector ê results in reduced processing requirements compared to a Viterbi decoder.

FIG. 1 shows a block diagram of a communication system 100 with a receiver 130 having a soft-decision decoder 170 according to a preferred embodiment. Receiver 130 is shown as part of a cellular radiotelephone subscriber unit 101, however, the receiver may alternately be part of a facsimile machine, modulator-demodulator (MODEM), two-way radio, or other communication device that receives convolutionally encoded signals. In the subscriber unit 101, a microphone 105 picks up audio signals which are then modulated by a transmitter 110 and broadcast by an antenna 120 through a duplexer 125. The antenna 120 also receives radio frequency (RF) signals from a complementary transmitter in a transceiver 199 such as a cellular base station. An RF front end 140 steps down the received RF signal to an analog baseband signal. An analog-to-digital (A/D) converter 146 converts the analog baseband signal to a digital signal. Digital demodulator 150 processes the digital signal to produce a demodulated received signal vector r.

The demodulated received signal vector r is connected to a soft-decision decoder 170. At the output of the soft-decision decoder 170, a digital-to-analog (D/A) converter 180 converts the maximum likelihood soft-decision decoded signal to the analog domain, and an audio amplifier 185 uses operational amplifiers to increase the gain of the recovered signal for reproduction through audio speaker 190.

Figure 2:
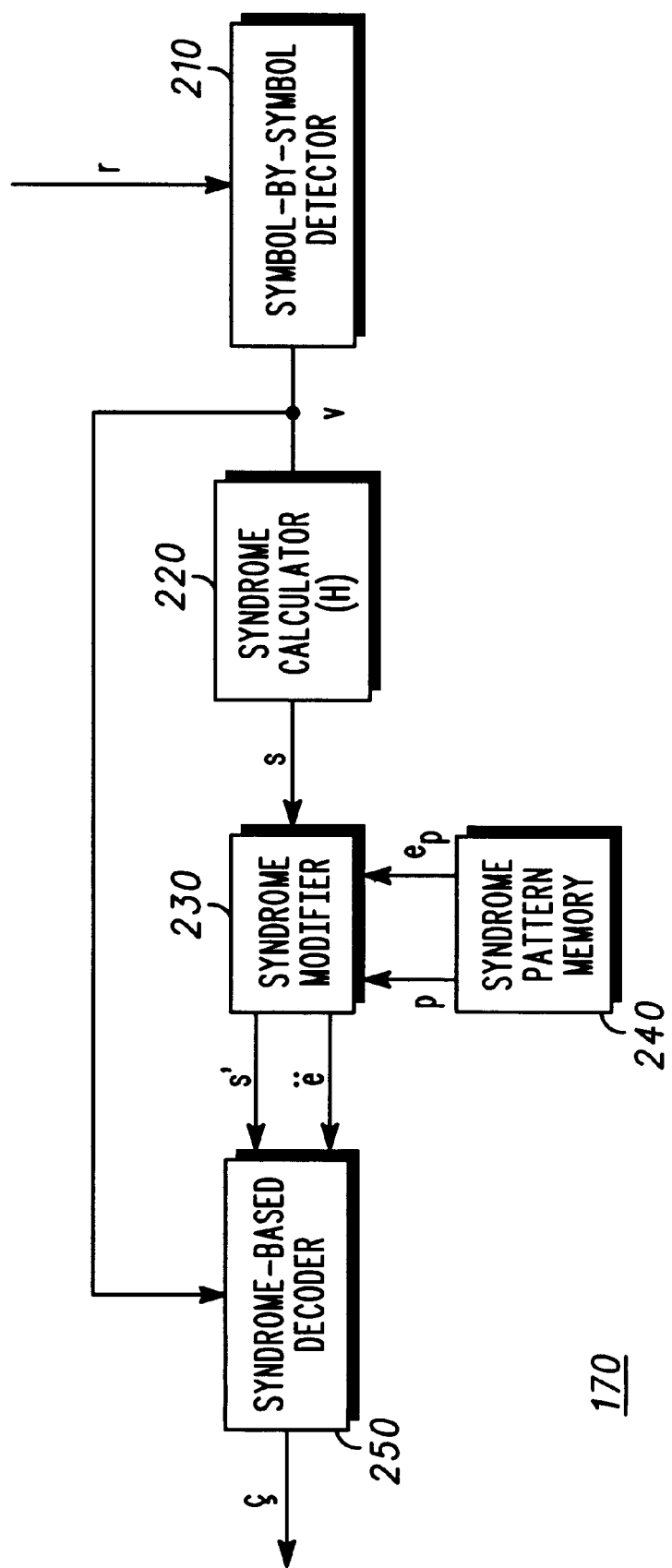
FIG. 2 shows a block diagram of the soft-decision decoder shown in FIG. 1 according to the preferred embodiment.

FIG. 2 shows a block diagram of the soft-decision decoder 170 shown in FIG. 1 according to the preferred embodiment. A demodulated received signal vector r enters the symbol-by-symbol detector 210 which produces a hard-decision vector v. The symbol-by-symbol detector merely examines the incoming signal and converts it to the closest valid (e.g., binary) symbol without regard for the value of the surrounding symbols. The output hard-decision vector v of a symbol-by-symbol detector 210 is not necessarily a valid code vector. A syndrome calculator 220 multiplies the hard-decision vector v by scalar parity check matrix H to produce a syndrome vector s. In the situation where syndrome vector s=0, then hard-decision vector v is the maximum likelihood estimated transmitted code vector ç, and it is guaranteed that hard-decision vector v would be identical to the output of a soft-decision decoder such as a Viterbi decoder.

If syndrome vector $s \neq 0$, the syndrome modifier 230 performs a search through the computed syndrome vector to detect predetermined syndrome patterns p stored in syndrome pattern memory 240, which correspond to specific error patterns $e_p$, such as single-error syndrome patterns or double-error syndrome patterns, in the received hard-decision vector v. If a syndrome pattern p is discovered in the syndrome vector, syndrome modifier 230 simplifies the syndrome vector by subtracting the syndrome pattern p and records the found error pattern $e_p$ in an estimated error vector $\ddot{e}$ according to the search results. The modified syndrome vector s' is simplified in the sense that it has more zeros than the original syndrome vector s. If s'=0, then the maximum likelihood transmission error vector $\hat{e}=\ddot{e}$, and the maximum likelihood estimated transmitted code vector ç=v−ê. If modified syndrome vector $s'=H(v-\ddot{e}) \neq 0$ after subtracting a found syndrome pattern p, the syndrome modifier 230 continues to search for syndrome patterns until all of the syndrome patterns in the syndrome pattern memory 240 have been compared with the modified syndrome vector s' or until the modified syndrome vector s'=0.

If, after all of the syndrome patterns in the syndrome pattern memory 240 have been compared to the modified syndrome pattern s', modified syndrome vector $s'=H(v-\ddot{e})$ still is not equal to all-zeros, then the modified syndrome vector s' is sent to a syndrome-based decoder 250 for use in constructing a simplified error trellis which is then used to compute remaining error vector e' based on soft-decision principles. Maximum likelihood transmission error vector $\hat{e}=\ddot{e}+e'$. Once the maximum likelihood error vector ê is computed, maximum likelihood estimated transmitted code vector ç=v−ê.

The search for the maximum likelihood transmission error vector ê that produces the syndrome vector s can be described by a search through an error trellis diagram for the path with the minimum accumulated weight. Meir Ariel & Jakov Snyders, "Soft Syndrome Decoding of Binary Convolutional Codes," 43 IEEE Transactions on Communications 288–297 (1995) provide an in-depth discussion and detailed examples on how to construct and decode an error trellis.

An error trellis that describes the same coset of the convolutional code to which the symbol-by-symbol vector v belongs is used to search for the remaining error vector e'. The shape of the error trellis depends only on the value of the computed syndrome vector, and a modified syndrome vector produces a simplified error trellis. An accelerated search through a simplified error trellis is possible due to its irregular structure. Under low bit-error rate conditions, the error trellis can be substantially simplified without affecting the optimality of the decoding procedure. In other words, the syndrome modifier 230 simplifies the syndrome vector to promote long strings of zeros, which allows the construction and processing of an error trellis by the syndrome-based decoder 250 to be more efficient.

Figure 3:
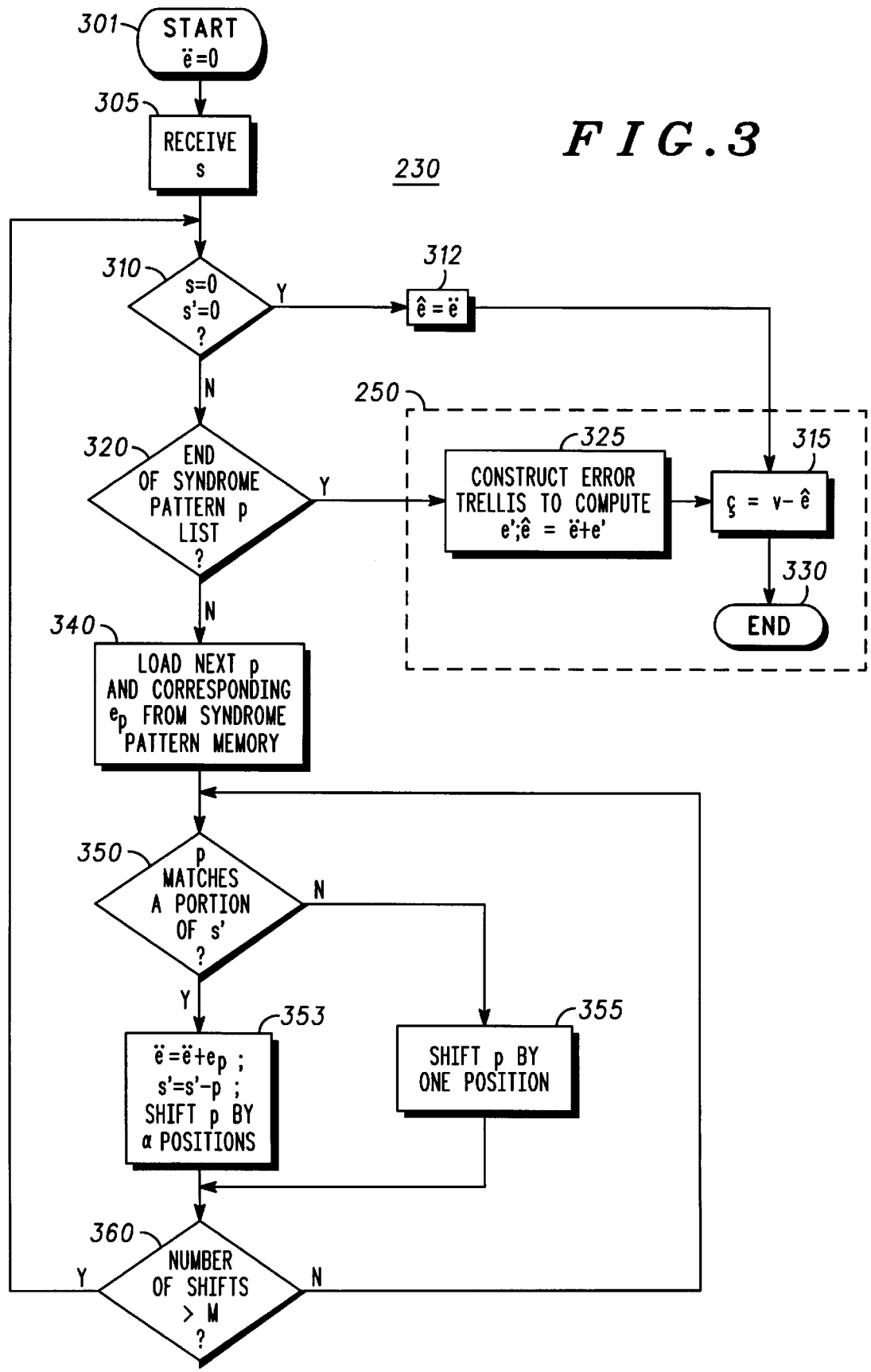
FIG. 3 shows a flow chart of the operation of the syndrome modifier shown in FIG. 2 according to the preferred embodiment.

FIG. 3 shows a flow chart of the operation of the syndrome modifier 230 and syndrome-based decoder 250 shown in FIG. 2 according to the preferred embodiment. The syndrome modifier 230 simplifies the syndrome vector to promote the presence of long strings of successive zero bits. At the start step 301, the estimated transmission error vector ë is reset to zero. In step 305, the syndrome vector s is obtained from syndrome calculator 220 (shown in FIG. 2). If the syndrome vector equals zero, as determined by step 310, then maximum likelihood transmission error vector ê= ë=0 as shown in step 312 and the hard-decision vector v is the maximum likelihood estimated transmitted code vector ç as shown in step 315. Once the maximum likelihood estimated transmitted code vector ç is determined, the process ends in step 330. This case, however, is unlikely to occur in practical systems at the first stage of the procedure.

If syndrome vector s≠0, the syndrome modifier 230 searches through the syndrome vector for known syndrome patterns p. This search is performed in several iterations, if necessary. Observe that a syndrome vector is a linear combination of the columns of a scalar parity check matrix H and, in the binary case, merely a sum of columns of matrix H. A single error in a hard-decision vector v produces a syndrome vector that equals the corresponding column of the scalar parity check matrix H. On the other hand, if multiple hard-decision vector errors are clustered, then their corresponding single-error syndrome patterns will overlap to generate a composite syndrome pattern that can no longer be easily identified.

Due to the structure of scalar parity check matrices, there is a limited number of syndrome patterns that correspond to single-symbol hard-decision vector errors. For instance, the scalar parity check matrix of a rate half binary convolutional code contains only two types of syndrome patterns that correspond to single-symbol hard-decision vector errors. In other words, all the columns of this type of scalar parity check matrix are shifted versions of the first two columns. For punctured convolutional codes, the number of different syndrome patterns that correspond to single-symbol hard-decision vector errors is greater than for nonpunctured codes, but still it is usually small enough to enable a relatively simple implementation of a syndrome modifier.

Step 340 loads a syndrome pattern p having a bits and its corresponding hard-decision vector error pattern $e_p$ from a predetermined list in syndrome pattern memory 240 (shown in FIG. 2). Step 350 searches for syndrome pattern p in a portion of the syndrome vector. If syndrome pattern p is identified in a portion of the syndrome vector, step 353 keeps a record of the location of the corresponding isolated hard-decision vector error by adding error pattern $e_p$ to estimated error vector ë, subtracts the syndrome pattern p from the syndrome vector, and moves the syndrome pattern to the right α bits, which is the length of the syndrome pattern p. If the syndrome pattern p does not match the portion of the syndrome vector, step 355 shifts the syndrome pattern one bit to the right.

After a shift step 353, 355, step 360 checks to see if the shifts have exceeded the length M of the syndrome vector. As long as the shifts have not exceeded length M, the syndrome pattern p is compared to succeeding portions of the syndrome vector. When the syndrome pattern p has been compared to each portion of the entire syndrome vector, the syndrome modifier returns to step 310 until either the modified syndrome vector equals zero, or all of the known syndrome patterns in the syndrome vector have been removed.

If, at the end of the iterative search as determined by steps 310, 320, modified syndrome vector s≠0, then syndrome-based decoder 250 uses the modified syndrome vector s' to construct an error trellis for computing the remaining error vector e' in step 325. The maximum likelihood transmission error ê=ë+e'. Syndrome-based decoder performs step 315 and computes the maximum likelihood estimated transmitted code vector ç by subtracting maximum likelihood transmission error vector ê from hard-decision vector v, and end step 330 occurs.

The modified syndrome vector s' is more suitable for the construction of an efficient error trellis than the original syndrome vector s. In other words, due to the removal of known syndrome patterns, the pattern of the remaining non-zero syndrome vector bits would correspond to clustered errors in the hard-decision vector v. In the desired circumstance, however, the search and elimination of known syndrome patterns will result in an all-zero modified syndrome vector at step 310, and construction of an error trellis in step 325 would be unnecessary.

If, at any time, the modified syndrome vector s' equals zero as determined by step 310, the maximum likelihood transmission error vector ê is equal to the estimated error vector ë as shown in step 312. In step 315, syndrome-based decoder 250 computes the maximum likelihood estimated transmitted code vector ç by subtracting maximum likelihood transmission error vector ê from hard-decision vector v, and end step 330 occurs.

Generally, removing a syndrome pattern p from the original syndrome vector s results in suboptimum decoding. Nevertheless, the loss in terms of the decoder's performance, in comparison with the optimal case, is controllable and can be reduced to nothing. The bit-error rate (BER) performance of the syndrome modifier depends on α, the bit length of syndrome pattern p. Increasing α by adding zero bits to the original syndrome pattern p increases the distance (in bits) between the hard decision vector error pattern $e_p$ under consideration and its potential neighboring hard-decision vector errors. Consequently, the probability that the identified syndrome pattern p was indeed produced by hard-decision vector error pattern $e_p$ increases with increasing α. Taking α to correspond to several times the constraint length of the code, but less than the length M of the syndrome vector, is usually sufficient to ensure no actual loss in coding gain, i.e., the BER performance is identical to that of an optimum Viterbi decoder.

Figure 4:
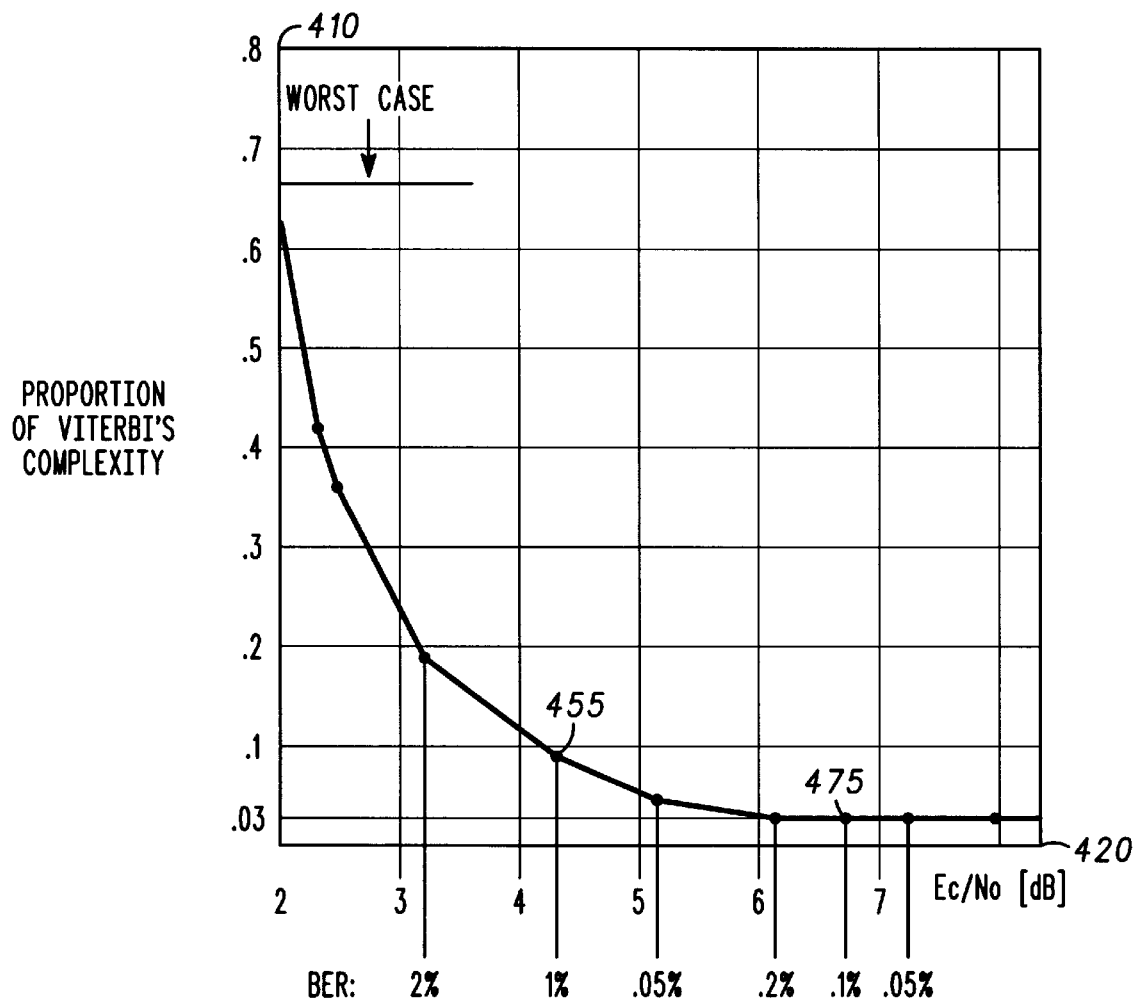
FIG. 4 shows a chart of the computational complexity of the soft-decision decoder shown in FIG. 2 as a percent of the complexity of a conventional Viterbi decoder.

FIG. 4 shows a chart of the computational complexity of the softdecision decoder shown in FIG. 2 as a proportion of the complexity of a conventional Viterbi decoder. The vertical axis 410 shows the proportion of the soft-decision decoder complexity with respect to a conventional Viterbi decoder. The horizontal axis 420 shows the noise figure. The measure of complexity is the number of real additions and comparisons required for the decoding. Here, the bit length α of the syndrome pattern p was chosen to be sixteen, i.e., hard-decision symbol errors whose distance from neighboring errors was at least thirty-two bits were found and eliminated. This bit length α was sufficient to ensure that the BER performance was identical to that of the Viterbi decoder, but with a substantially reduced computational complexity. With a shortened bit length α less that sixteen, the BER performance may be less than optimal, however the computational complexity would be still further reduced.

Under moderate BER conditions, the syndrome modifier 230 (shown in FIG. 2) significantly reduces the computational complexity and current drain of the syndrome-based decoding procedure without loss of optimality. As an example, for a GSM half-rate vocoder on a Motorola ONYX digital signal processor, the syndrome modifier and syndrome-based decoder reduce the machine cycles by 92% compared to conventional Viterbi decoding when the BER of the received signal is 1% as shown by point 455, and the syndrome modifier and the syndrome-based decoder reduce the machine cycles by 97% compared to Viterbi decoding when the BER of the received signal is 0.1% as shown by point 475.

In summary, a syndrome modifier in conjunction with a syndrome-based decoder eliminates or simplifies the construction of an error trellis and reduces the computational complexity of syndrome-based decoding of a demodulated received signal vector. In low transmission error situations, the syndrome modifier and syndrome-based decoder has a much reduced computational complexity compared to a Viterbi decoder. While specific components and functions of the soft-decision syndrome-based decoder for convolutional codes are described above, fewer or additional functions could be employed by one skilled in the art within the true spirit and scope of the present invention. The invention should be limited only by the appended claims.

We claim:

1. A soft-decision syndrome-based decoder for decoding a demodulated received signal comprising:
    a hard-decision detector for creating a hard-decision vector from a demodulated received signal vector;
    a syndrome calculator, coupled to the hard-decision detector, for computing a syndrome vector from a parity check matrix and the hard-.decision vector; and
    a syndrome modifier, coupled to the syndrome calculator, for locating and removing a syndrome pattern from the syndrome vector to create a modified syndrome vector.

2. A soft-decision syndrome-based decoder according to claim 1 wherein the syndrome modifier computes an estimated error vector based on the syndrome pattern.

3. A soft-decision syndrome-based decoder according to claim 2 further comprising:
    a syndrome pattern memory, coupled to the syndrome modifier, for storing the syndrome pattern.

4. A soft-decision syndrome-based decoder according to claim 3 wherein the syndrome pattern memory also stores a hard-decision vector error pattern, associated with the syndrome pattern, used for computing an estimated error vector.

5. A soft-decision syndrome-based decoder according to claim 2 further comprising:
    a syndrome-based decoder, coupled to the syndrome modifier, for computing a remaining error vector using the modified syndrome vector.

6. A soft-decision syndrome-based decoder according to claim 5 wherein the syndrome-based decoder subtracts the estimated error vector and the remaining error vector from the hard-decision vector to produce an estimated transmitted code vector.

7. A radiotelephone having a soft-decision syndrome-based decoder comprising:
    a hard-decision detector, for computing a hard-decision vector from a demodulated received signal vector;
    a syndrome calculator, coupled to the hard-decision detector, for computing a syndrome vector from the hard-decision vector and a parity check matrix;
    a syndrome pattern memory for storing a syndrome pattern;
    a syndrome modifier, coupled to the syndrome calculator and the syndrome pattern memory, for locating and removing the syndrome pattern from the syndrome vector to create a modified syndrome vector; and
    a syndrome-based decoder, coupled to the syndrome modifier, for computing an estimated transmitted code vector using the modified syndrome vector.

8. A radiotelephone having a soft-decision syndrome-based decoder according to claim 7 wherein the syndrome modifier computes an estimated error vector based on the syndrome pattern.

9. A radiotelephone having a soft-decision syndrome-based decoder according to claim 8 wherein the syndrome-based decoder computes a remaining error vector from the modified syndrome vector.

10. A radiotelephone having a soft-decision syndrome-based decoder according to claim 9 wherein the syndrome-based decoder subtracts the estimated error vector and the remaining error vector from the hard-decision vector to produce an estimated transmitted code vector.

11. A radiotelephone having a soft-decision syndrome-based decoder according to claim 7 wherein the syndrome-based decoder computes a remaining error vector from the modified syndrome vector.

12. A method for soft-decision syndrome-based decoding a demodulated received signal comprising the steps of:
    hard-decision detecting a demodulated received signal vector to produce a harddecision vector;
    multiplying the hard-decision vector by a parity check matrix to calculate a syndrome vector;
    verifying if the syndrome vector is a zero vector; and
    if the syndrome vector is not a zero vector, locating and removing a syndrome pattern from the syndrome vector to create a modified syndrome vector and an estimated error vector.

13. A method for soft-decision syndrome-based decoding a demodulated received signal according to claim 12 further comprising the steps of:
    computing a remaining error vector from the modified syndrome vector; and
    calculating an estimated transmitted code vector from the hard-decision vector, the estimated error vector, and the remaining error vector.

14. A method for soft-decision syndrome-based decoding a demodulated received signal according to claim 12 further comprising the steps of:
    if the syndrome vector is a zero vector, calculating an estimated transmitted code vector from the hard-decision vector.

* * * * *

UNITED STATES PATENT AND TRADEMARK OFFICE
CERTIFICATE OF CORRECTION

PATENT NO. : 6,009,552
DATED : December 28, 1999
INVENTOR(S) : Ariel, Meir, et al.

It is certified that error appears in the above-indentified patent and that said Letters Patent is hereby corrected as shown below:

Title Page

Item [57] Abstract
Replace "decoder computes" with -- decoder (170) computes --.

Item (57) - Abstract
Replace "symbol-by-symbol detector determines" with -- symbol-by-symbol detector (210) determines --.

Item [57] - Abstract
Replace "syndrome calculator multiplies" with -- syndrome calculator (220) multiplies --

Item [57] - Abstract
Replace "syndrome modifier examines" with -- syndrome modifier (230) examines

UNITED STATES PATENT AND TRADEMARK OFFICE
CERTIFICATE OF CORRECTION

PATENT NO. : 6,009,552
DATED : December 28, 1999
INVENTOR(S) : Ariel, Meir, et al.

It is certified that error appears in the above-identified patent and that said Letters Patent is hereby corrected as shown below:

Item [57] - Abstract
    Replace "syndrome-based decoder uses" with
-- syndrome-based decoder (250) uses --

Signed and Sealed this

First Day of May, 2001

Attest:

NICHOLAS P. GODICI

*Attesting Officer*      *Acting Director of the United States Patent and Trademark Office*